United States Patent
Cheong

(10) Patent No.: US 6,844,259 B2
(45) Date of Patent: Jan. 18, 2005

(54) METHOD FOR FORMING CONTACT PLUG IN SEMICONDUCTOR DEVICE

(75) Inventor: Woo-Seock Cheong, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/331,724

(22) Filed: Dec. 31, 2002

(65) Prior Publication Data
US 2003/0186533 A1 Oct. 2, 2003

(30) Foreign Application Priority Data
Mar. 30, 2002 (KR) .................. 10-2002-0017679

(51) Int. Cl.⁷ .................................. H01L 21/44
(52) U.S. Cl. .............. 438/657; 438/629; 438/647; 438/672; 438/675; 438/565
(58) Field of Search .................... 438/621, 626, 438/629, 631, 637, 658, 663, 680, 906, 913, 914, FOR 240, FOR 250, FOR 269, FOR 270, FOR 448, 657, 672, 565, 647, 675, FOR 351

(56) References Cited
U.S. PATENT DOCUMENTS

| | | | |
|---|---|---|---|
| 5,475,257 A | 12/1995 | Hashimoto et al. | |
| 6,030,894 A | * 2/2000 | Hada et al. | 438/675 |
| 6,187,659 B1 | 2/2001 | Ying et al. | |
| 6,249,010 B1 | 6/2001 | Bergemont et al. | |
| 6,268,281 B1 | * 7/2001 | Shih et al. | 438/629 |
| 6,362,023 B1 | 3/2002 | Bergemont et al. | |

FOREIGN PATENT DOCUMENTS

JP  10-27847  1/1998  ......... H01L/21/768

* cited by examiner

Primary Examiner—George Fourson
Assistant Examiner—Julio J. Maldonado
(74) Attorney, Agent, or Firm—Piper Rudnick LLP

(57) ABSTRACT

The present invention provides a method for forming a contact plug in a semiconductor device capable of preventing an increase of contact resistance even if the contact size becomes smaller and degradation of a step coverage property and of suppressing a decrease of uniformity in the contact resistance. The inventive method includes the steps of: a method for forming a contact plug in a semiconductor device, comprising the steps of: forming a contact hole by etching an insulating layer on a substrate; forming a first silicon film with a first doping concentration on the substrate in the contact hole so that the contact hole is partially filled; flushing a doping gas on a surface of the first silicon film; and forming a second silicon film having a second doping concentration higher than the first doping concentration on the first silicon film until filling the contact hole.

17 Claims, 7 Drawing Sheets

METHOD FOR FORMING CONTACT PLUG IN SEMICONDUCTOR DEVICE

FIELD OF THE INVENTION

The present invention relates to a method for fabricating a semiconductor device; and, more particularly, to a method for forming a contact plug with a double polysilicon (DPS) thin film in a semiconductor device.

DESCRIPTION OF RELATED ARTS

Recently, the size of a contact plug decreases as a level of integration of a semiconductor device progressively advances. Due to this decreased size of the contact plug, contact resistance of a typically used silicon plug conversely increases. Especially, an oxide formed at an interface of the contact plug is one of causes for increasing the contact resistance of the silicon plug with multi-crystals. Hence, a cleaning process is applied to remove the oxide in order to reduce the contact resistance of the silicon plug with multi-crystals.

However, in case of removing a layer constructed with the oxide by cleaning a semiconductive substrate through an ex-situ cleaning process, a native oxide layer is formed while the semiconductive substrate completed with the ex-situ cleaning process is loaded to a deposition equipment. For this reason, it is impossible to remove completely the oxide formed at the interface of the contact plug. Therefore, if the size of the contact plug decreases with a state that the native oxide layer still exists, the contact resistance increases in more extents. Accordingly, an in-situ cleaning process should be used in order to maximally suppress the generation of the native oxide layer.

A conventional polysilicon plug process is mostly carried out in a tube-type deposition equipment or a single wafer-type deposition equipment.

In case of forming the contact plug by depositing a silicon thin film through the tube-type deposition equipment, it is possible for the silicon thin film to obtain a good step coverage property but impossible to perform the in-situ cleaning process. Hence, the silicon thin film is inevitably deposited after performing the ex-situ cleaning process. However, the native oxide layer is formed in the course of a procedure for loading a wafer to the tube-type deposition equipment for depositing the silicon thin film.

Since the singe wafer-type deposition equipment have a cleaning function, it is possible to perform the in-situ cleaning process and deposit the silicon thin film under this in-situ environment, thereby preventing the native oxide layer from being produced.

As mentioned the above, if the contact plug is formed in the single wafer-type deposition equipment, it is possible to remove the native oxide layer formed at the interface of the contact plug by applying a bake or a rapid thermal process (RTP) in an atmosphere of hydrogen or a cleaning process. However, compared to use of the tube-type deposition equipment, such characteristics as uniformity and the step coverage become poor when the contact plug size is smaller. In particular, a level of uniformity in the contact resistance decreases.

Also, because of the reduced contact size and an increase of an aspect ratio, a sufficient gap-fill should be proceeded by depositing the silicon. However, the single wafer-type deposition equipment has poor gap-fill ability, compared to the tube-type deposition equipment.

FIGS. 1A and 1B are graphs illustrating changes of contact resistance of a contact plug in accordance with a conventional contact size.

With reference to FIG. 1A, the graphs show values of the contact resistance obtained at 0.18 $\mu$m of each contact size. The singe wafer-type deposition equipment shows the contact resistance and uniformity relatively similar to a selective epitaxial growth (SEG) or a tube type DF33.

However, in case that the contact size is reduced to 0.14 $\mu$m, the contact resistance of a solid phase epitaxy (SPE) or an advanced poly process (APP) increases, resulting in poor uniformity in overall and a sharp increase of an average contact resistance.

SUMMARY OF THE INVENTION

It is, therefore, an object of the present invention to provide a method for forming a contact plug in a semiconductor device capable of preventing a decrease of contact resistance even if a contact size becomes smaller and degradation of uniformity in the contact resistance due to a poor step coverage.

In accordance with an aspect of the present invention, there is provided a method for forming a contact plug in a semiconductor device, comprising the steps of: forming a contact hole by etching an insulating layer on a substrate; forming a first silicon film with a first doping concentration on the substrate in the contact hole so that the contact hole is partially filled; flushing a doping gas on a surface of the first silicon film; and forming a second silicon film having a second doping concentration higher than the first doping concentration on the first silicon film until filling the contact hole.

In accordance with another aspect of the present invention, the step of flushing the doping gas is proceeded in an in-situ environment after forming the first silicon film. Also the step of flushing the doping gas is carried out for about 5 seconds to 20 seconds while flowing about 20 sccm to about 500 sccm of the doping gas obtained by adding a small amount of $PH_3$ to hydrogen. The identical temperature and pressure implemented for forming the first silicon film are used for flushing the doping gas.

In accordance with still another aspect of the present invention, the step of cleaning the contact hole further includes the steps of: performing a first cleaning in an ex-situ environment; and performing a second cleaning in an in-situ environment. Also, the step of performing the second cleaning is proceeded at a single wafer-type deposition equipment by descending a temperature ascended instantaneously up to about 900° C. to about 950° C. with a heating rate ranging from about 10° C. per second to about 100° C. per second in an atmosphere of hydrogen.

In accordance with still another aspect of the present invention, the first silicon film is formed at a single wafer-type chemical vapor deposition equipment in an in-situ environment. Particularly, the first silicon film is deposited at a pressure ranging from about 5 Torr to about 50 Torr and a temperature ranging from about 500° C. to about 650° C. by providing a mixed gas of $SiH_4$, $H_2$ and about 1% of $PH_3$ added to the $H_2$. Also, the first predetermined concentration ranges from about $1 \times 10^{19}$ atoms/cm$^3$ to about $21 \times 10^{20}$ atoms/cm$^3$.

In accordance with further aspect of the present invention, the second silicon film is formed in a tube-type chemical vapor deposition equipment. Particularly, the second silicon film is deposited at a pressure ranging from about 0.1 Torr to about 1 Torr and a temperature ranging from about 510°

C. to about 610° C. while providing a mixed gas of $SiH_4$, $H_2$ and about 1% of $PH_3$ added to the $H_2$. Also, the second predetermined concentration ranges from about $1\times10^{20}$ atoms/cm$^3$ to about $31\times10^{21}$ atoms/cm$^3$.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

FIGS. 2A to 2E are cross-sectional views illustrating a method for forming a contact plug with a double polysilicon (DPS) thin film in a semiconductor device in accordance with a preferred embodiment of the present invention.

Figure 1:
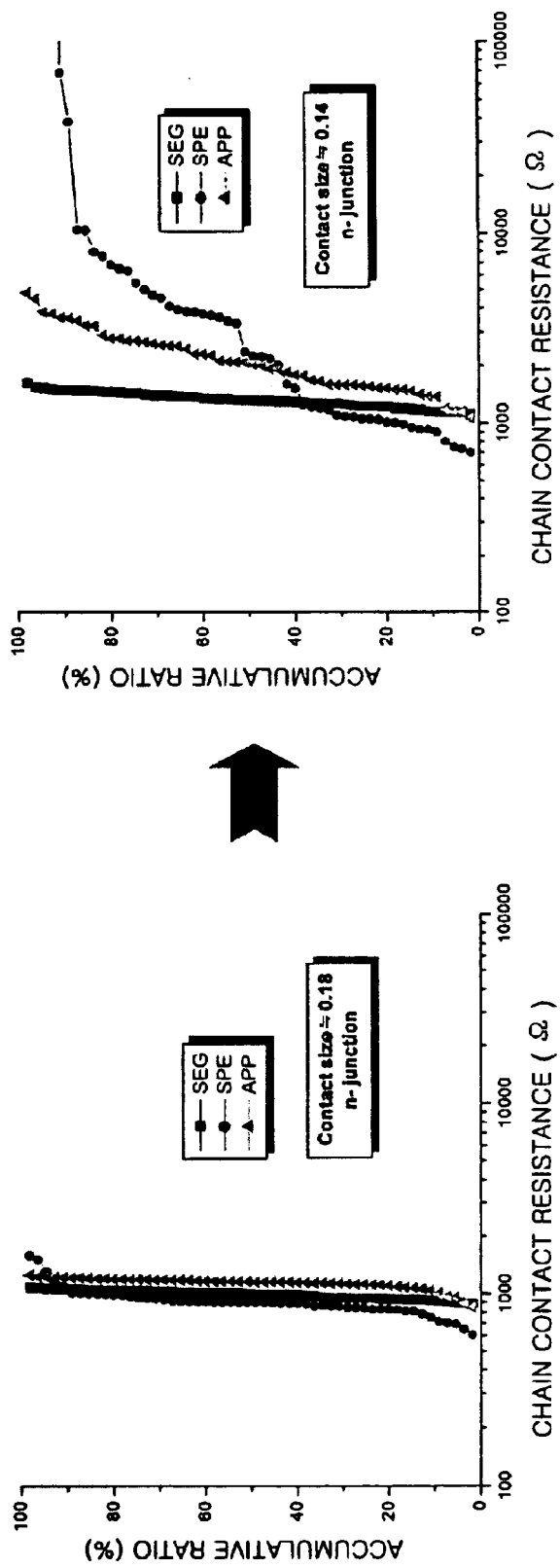
FIGS. 1A and 1B are graphs showing changes of contact resistance of a contact plug in accordance with a conventional contact size.
Figure 2A:
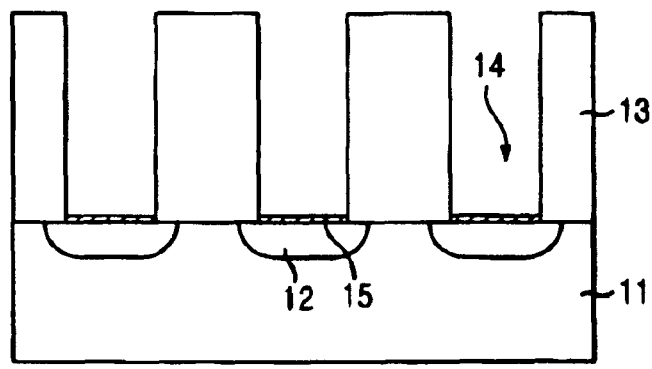
FIGS. 2A to 2E are cross-sectional views illustrating a method for forming a contact plug in accordance with a preferred embodiment of the present invention.
Figure 2B:
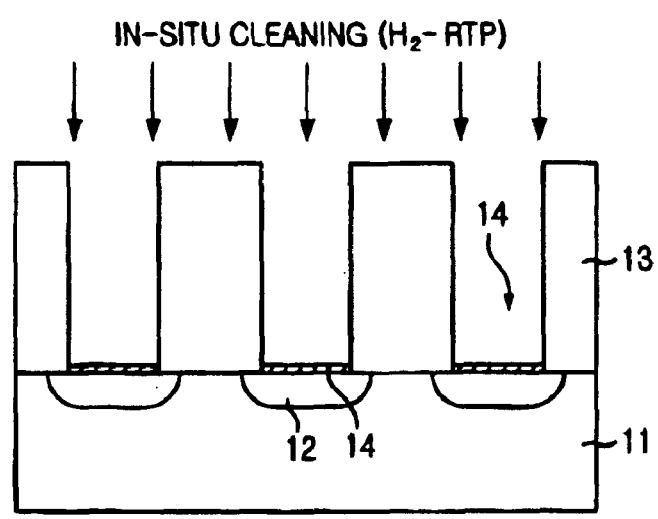

Referring to FIG. 2A, an inter-layer insulating layer 13 is formed on a substrate 11 providing various elements including a junction area 12. Then, a predetermined portion of the inter-layer insulating layer 13 is etched to form a contact hole 14 that exposes the junction area 12 of the substrate 11.

At this time, a native oxide layer 15 is formed on a surface of the junction area 12 exposed through the formation of the contact hole 14. Also, while forming the contact hole 14, there by-produced remnants from the etching and a damaged layer through the etching at the junction area 12. The remnants and the damaged layer degrade a characteristic of leakage currents of a semiconductor device. Also, the native oxide layer 15 increases contact resistance, and thus, becomes a factor for reducing an electric characteristic of the semiconductor device.

Before removing the native oxide layer 15, the remnants and the damaged layer that are by-produced in the course of forming the contact hole 14 by etching the predetermined portion of the inter-layer insulating layer 13 are removed by employing a thermal oxidation technique, a hydrogen annealing technique or a plasma cleaning technique.

Firstly, the thermal oxidation technique is a process wherein a thermal oxide layer is formed at a junction area in a contact hole by maintaining a temperature in a range from about 900° C. to about 1000° C. and then removed through a shallow wet dip process by using an aqueous solution of HF diluted in a ratio of about 50 to about 1. That is, the remnants and the damaged layer are removed after being substituted for forming the thermal oxide layer. Secondly, the hydrogen annealing technique is a process of providing hydrogen at a temperature ranging from about 900° C. to about 1000° C. for about 5 minutes to about 10 minutes. Thirdly, the plasma cleaning technique is a cleaning process carried out at a low power ranging from about 1 W to about 50 W with $NF_3$ or $SiF_6$ including $H_2$.

After removing the remnants and the damaged layer through one of the above techniques, a first cleaning process is proceeded in an ex-situ environment with a wet-dip process before depositing a silicon plug. The first cleaning process is to remove contaminants produced by such contaminator as carbon and oxides. Particularly, a solution of $H_2SO_4$ and $H_2O_2$, obtained by diluting $H_2SO_4$ of which dilution ratio ranges from about 10 to about 50 with $H_2O_2$ of which dilution ratio is about 1, is applied for about 5 minutes to about 10 minutes to remove carbon contaminants. Afterwards, a diluted aqueous solution of HF is applied for about 10 seconds to 60 seconds to remove the oxide contaminants. Herein, the aqueous solution HF is diluted in a ratio ranging from about 50 to about 500 with $H_2O$ of which ratio is about 1.

Referring to FIG. 2, after the ex-situ cleaning process, the substrate 11 is loaded to a single wafer-type deposition equipment so that a second cleaning process is proceed in an in-situ environment. The in-situ cleaning process is for removing the native oxide layer 15 at a surface of the junction area 12 by performing a $H_2$-rapid thermal annealing process (hereinafter referred as to $H_2$-RTP).

The $H_2$-RTP process for removing the native oxide layer 15 is performed by descending a temperature that has been set to rise instantaneously up to a range between 900° C. to 950° C. with a heating rate ranging from about 10° C. per second to about 100° C. per second.

Figure 2C:
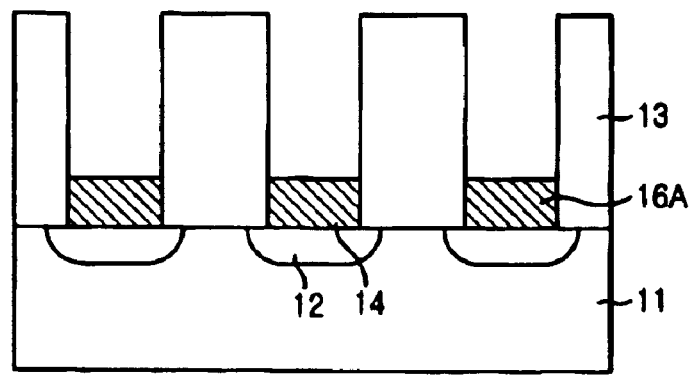

Referring to FIG. 2C, inside of the single wafer-type deposition equipment proceeded with the in-situ cleaning process, a first silicon thin film 16A with a first predetermined concentration is deposited on the junction area 12 in the contact hole 14. Herein, the first silicon thin film 16A is directly deposited in the single wafer-type deposition equipment without being exposed in air after the in-situ cleaning process.

Meanwhile, the first silicon thin film 16A is deposited up to about 5% to 30% of a total contact hole size. Preferably, the first silicon thin film 16A is deposited to a thickness ranging from about 40 Å to about 400 Å.

Also, the deposition of the first silicon thin film 16A is carried out at a temperature ranging from about 550° C. to about 650° C. and a pressure ranging from about 5 Torr to about 50 Torr by providing a mixed gas obtained by mixing SiH4, H2 and approximately 1% of $PH_3$ added to the $H_2$. At this time, a flow quantity of the $SiH_4$ ranges from about 50 scam to about 300 scam while that of the $H_2$ is maintained in a range from about 500 scam to about 10000 scam. Also, a flow quantity of the mixed gas ranges from about 10 scam to about 50 sccm.

In accordance with the above conditions, the first silicon thin film 16A is deposited in such that the first predetermined concentration ranges from about $1\times10^{19}$ atoms/cm$^3$ to about $21\times10^{20}$ atoms/cm$^3$. The reason for depositing the first silicon thin film 16A with such low concentration is to retain a cleaned state of the junction area 12 and prevent out-diffusion of phosphorus doped on the junction area 12 through a thermal budget according to a subsequent thermal process.

Generally, a deposited layer proceeded at the single wafer-type chemical vapor deposition (CVD) equipment has a problem of degraded uniformity and step coverage characteristics compared to the one proceeded at other types of deposition techniques. However, the first silicon thin film 16A is not affected by the degradations of step coverage and uniformity because it is thinly deposited to a thickness ranges from about 40 Å to about 400 Å. Preferably, since the singe wafer-type CVD equipment has a cleaning function, the first silicon thin film 16A can be deposited under the in-situ environment after performing the cleaning process, thereby preventing the native oxide layer 15 from being produced at the interface between the first silicon thin film 16A and the junction area 12. As result, it is further possible to prevent an increase of contact resistance due to the native oxide layer 15.

Figure 2D:
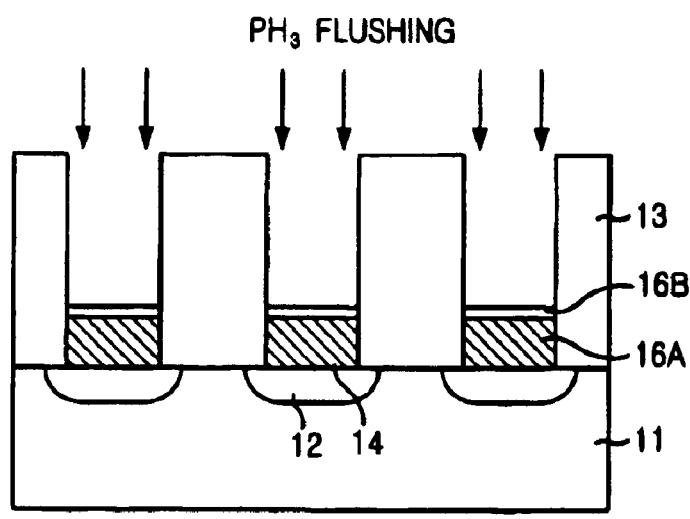

Referring to FIG. 2D, after depositing the first silicon thin film 16A, the $PH_3$ included in $H_2$ gas as a doping gas is flushed under the in-situ environment. This flushing process is to form a dopant absorption layer 16B on a surface of the first silicon thin film 16A. The dopant absorption layer 16B diminishes an effect of increasing the contact resistance with a subsequent second silicon thin film.

When depositing the second silicon thin film under an ex-situ environment, it is difficult to suppress a formation of a thin oxide layer at an interface between the first and the second thin films. However, it is possible to suppress the increase of contact resistance if applying the flushing to a surface of the first silicon thin film 16A with a high concentration of the $PH_3$ gas at the end of a step for completing the deposition of the first silicon thin film 16A.

The flushing process for forming the dopant absorption layer 16B is carried out with the same temperature and pressure applied to the deposition process of the first silicon thin film 16A for about 5 seconds to 20 seconds but with a flow quantity of a doping gas containing $H_2$ gas that includes about 10% of $PH_3$ gas ranging from about 20 sccm to about 500 sccm.

Figure 2E:
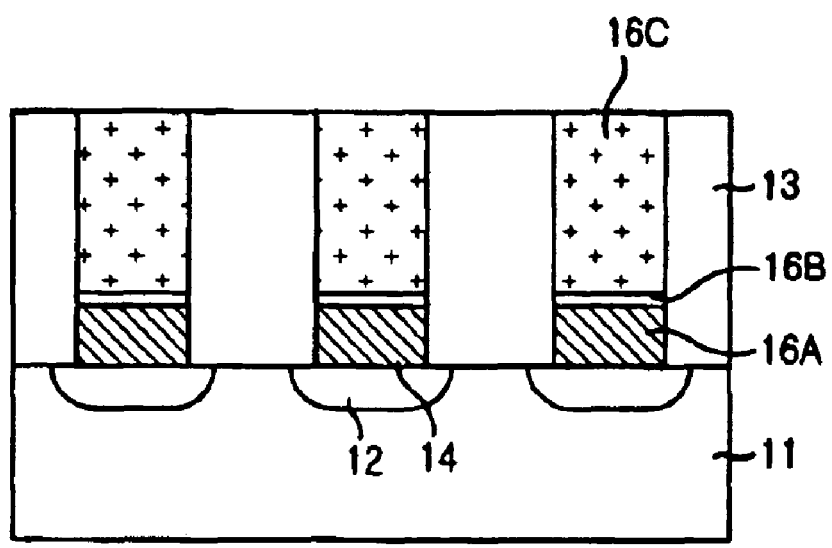

Referring to FIG. 2E, the second silicon thin film 16C with a second predetermined concentration is deposited on the first silicon thin film 16A and particularly on the dopant absorption layer 16B until completely filling the contact hole 14.

By proceeding the above processes, a contact plug 16 including the first and the second silicon thin films 16A and 16C is formed. The second silicon thin film 16C is consecutively deposited at a tube-type CVD equipment without any delaying after completing the deposition of the first silicon thin film 16A.

Meanwhile, the second silicon thin film 16C is deposited at a pressure ranging from about 0.1 Torr to about 1 Torr and a temperature ranging from about 510° C. to about 610° C. by providing a mixed gas obtained by mixing $SiH_4$ gas, $H_2$ gas and approximately 1% of $PH_3$ added to the $H_2$ gas. A flow quantity of the $SiH_4$ gas ranges from about 200 sccm to about 2000 sccm while that of H2 gas ranges from about 500 sccm to about 5000 sccm. Also, the mixed gas has a flow quantity ranging from about 100 sccm to about 1000 sccm. At this time, when depositing the second silicon thin film 16C, a deposition rate is maintained below about 50 Å per minute in order to improve a gap-fill property.

In accordance with the above provided conditions, the second silicon thin film 16C is deposited with the second concentration ranging from about $1 \times 10^{20}$ atoms/cm$^3$ to about $31 \times 10^{21}$ atoms/cm$^3$.

Since the second silicon thin film 16C is formed at the tube-type CVD equipment, it is possible to prevent occurrences of a seam or a void phenomenon at the contact hole 14 having a high aspect ratio by improving a step coverage characteristic.

The second silicon thin film 16C is formed by loading it to the tube-type CVD equipment after forming the first silicon thin film 16A at the single wafer-type CVD equipment. Since the second silicon thin film 16C is formed instantaneously after forming the first silicon thin film 16A, the formation of the native oxide layer is maximally controlled. Although the native oxide layer may be formed during the formation of the second silicon thin film 16C, it does not increase the contact resistance because uniformity of the interface is not retained due to a subsequent thermal process.

Then, a predetermined number of planarization processes are used to remove the second silicon thin film 16C on a top part of the inter-layer insulating layer 13 so as to provide contact plugs each being electrically independent.

Figure 3A:
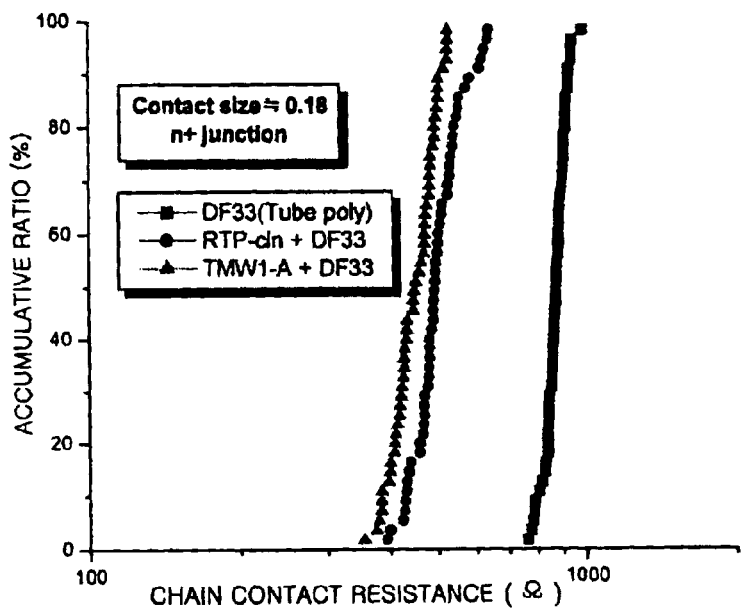
FIGS. 3A to 3C are graphs showing values of contact resistance of a contact plug in accordance with the preferred embodiment of the present invention.
Figure 3B:
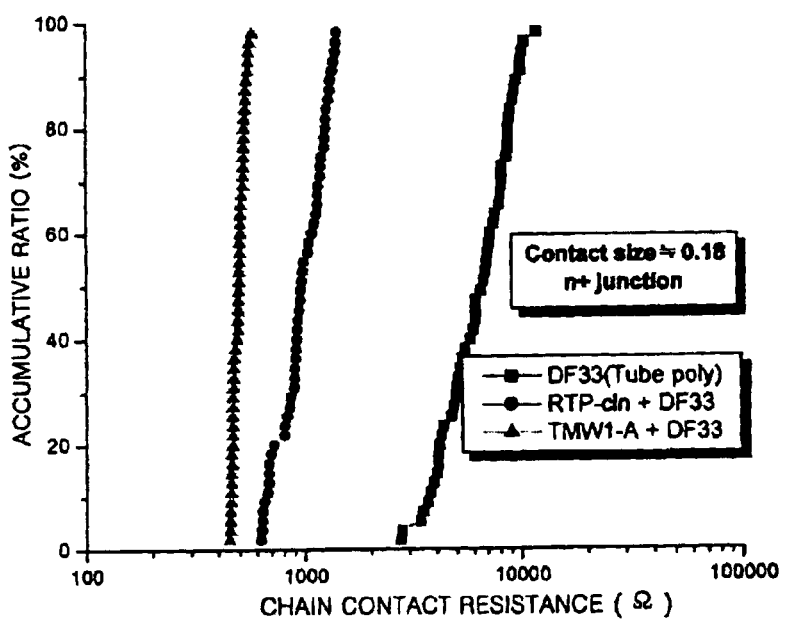
Figure 3C:
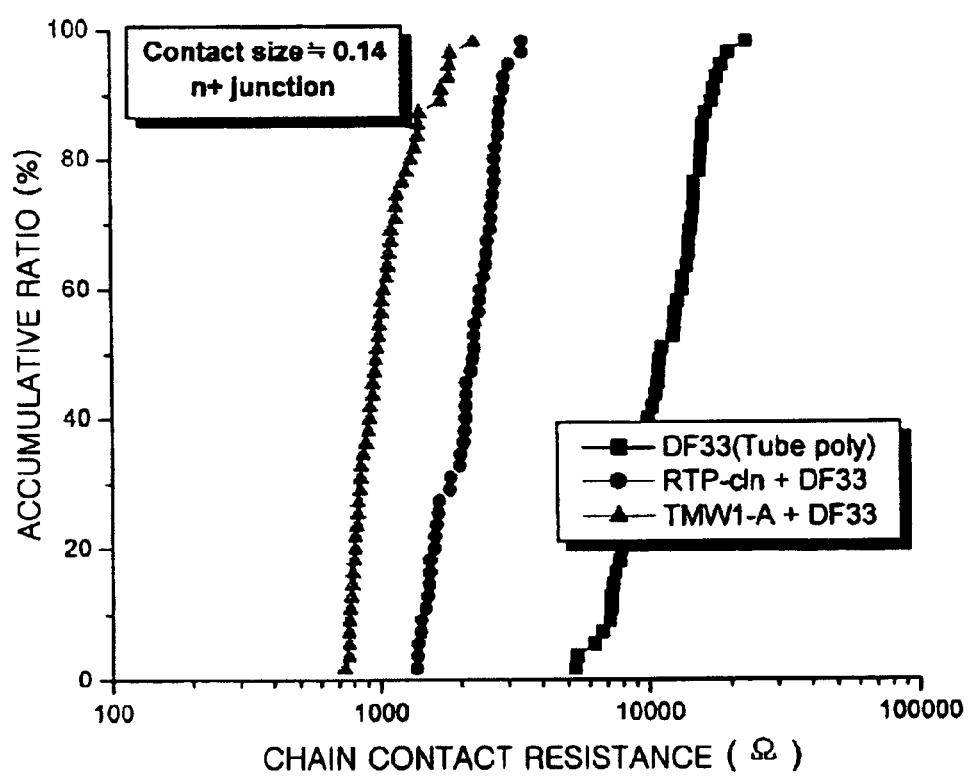

FIGS. 3A to 3C are graphs showing analyses of contact resistance values of a contact plug in accordance with a preferred embodiment of the present invention. In order to analyze the contact resistance of the contact plug itself, a Kelvin contact resistance ($R_c$) pattern is employed. On the other hand, a chain contact resistance ($R_c$) pattern is used to evaluate uniformity of the contact resistance.

FIG. 3A shows the Kelvin contact resistance pattern in case that a contact size is about 0.18 μm. A polysilicon plug TMW1–A+DF333 provided by the present invention has the contact resistance decreased about 50% of a polysilicon plug DF33 deposited through the conventional tube-type deposition equipment. In addition, a sample RTP–cln+DF33 proceeded only with a $H_2$–RTP in an ex-situ environment also has the contact resistance decreased about 30% to about 40% of the conventional polysilicon plug.

FIG. 3B shows contact resistance in about 0.18 μm of a contact size. An effect of decreasing the contact resistance is identical to the contact resistance shown in FIG. 3A.

FIG. 3C shows contact resistance in case that a contact size is about 0.14 μm. Compared to the contact resistances shown in FIGS. 3A and 3B, the chain contact resistance shows a better uniformity than the Kelvin contact resistance, and the double polysilicon plug has a better contact resistance than the polysilicon plug formed in the conventional tube-type deposition equipment. The contact resistance is about 10%, and the uniformity is excellent as well.

The reason for the above result is due to a single crystal characteristic of an interface between the polysilicon plugs. This fact is verified from an evaluation on characteristics in current (I) and voltage (V).

Figure 4:
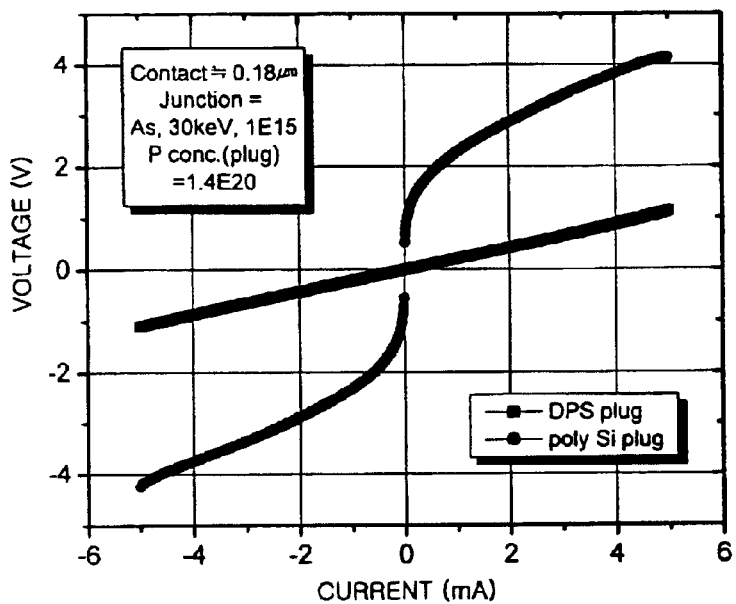
FIG. 4 is a diagram showing a comparison between current (I) and voltage (V) in a semiconductor device including a conventional tube-type polysilicon plug and a double polysilicon plug provided in accordance with the present invention.

FIG. 4 is a diagram showing a comparison between I and V characteristics of two semiconductor devices, one having a polysilicon plug formed through the conventional tube-type deposition equipment and the other having double polysilicon plug formed in accordance with the present invention. At a low current forcing part, the double polysilicon (hereinafter referred as to DPS) plug shows a characteristic of omic contact, which represents an interface having a single crystal. On the other hand, the polysilicon plug formed through the tube-type deposition equipment shows a characteristic of non-omic contact, which represents that an insulating material exists at the interface between the polysilicon plugs.

Particularly, a sharp increase of the contact resistance at a low current can degrade operational characteristics of the semiconductor device. The existence of the insulating material at the interface is verified through an evaluation of the Kelvin contact resistance in accordance with a temperature.

Figure 5:
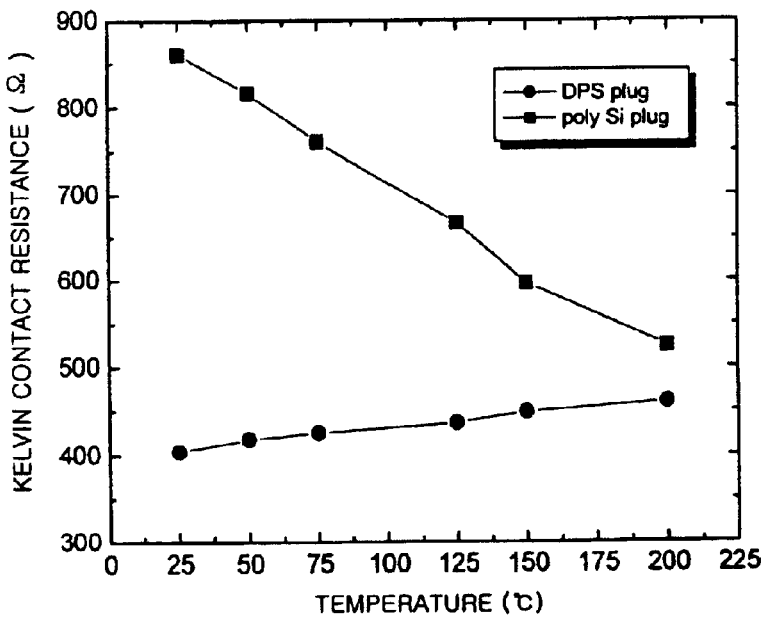
FIG. 5 is a graph showing a characteristic of the Kelvin contact resistance in accordance with a temperature set for the present invention.

FIG. 5 is a diagram showing the Kelvin contact resistance in accordance with a temperature.

With reference to FIG. 5, the DPS exhibits characteristics of a typical silicon plug. That is, the contact resistance progressively increases as the temperature increases. Contrarily, the polysilicon plug shows that the contact resistance decreases as the temperature increases.

In accordance with the present invention, a single crystal silicon plug is formed through a polysilicon deposition method, thereby minimizing contact resistance. Also, since the present invention relates to a polysilicon process, there occur less process heat loads, thereby being able to prevent thermal degradation of a semiconductor device. Furthermore, it is possible to prevent degradation of step coverage due to use of the tube-type silicon deposition equipment and to improve uniformity of the contact resistance.

While the present invention has been described with respect to certain preferred embodiments, it will be apparent to those skilled in the art that various changes and modifications may be made without departing from the scope of the invention as defined in the following claims.

What is claimed is:

1. A method for forming a contact plug in a semiconductor device, comprising the steps of:

forming a contact hole by etching an insulating layer on a substrate;

forming a first silicon film with a first doping concentration on the substrate in the contact hole so that the contact hole is partially filled;

flushing a doping gas on a surface of the first silicon film; and forming a second silicon film having a second doping concentration higher than the first doping concentration on the first silicon film until filling the contact hole.

2. The method as recited in claim 1, wherein the step of flushing the doping gas is proceeded in an in-situ environment after forming the first silicon film.

3. The method as recited in claim 1, wherein the step of flushing the doping gas is carried out for about 5 seconds to 20 seconds while flowing about 20 sccm to about 500 sccm of the doping gas obtained by adding $PH_3$ to hydrogen.

4. The method as recited in claim 1, wherein the step of flushing the doping gas is carried out at the identical temperature and pressure implemented for forming the first silicon film.

5. The method as recited in claim 1, further comprising the step of cleaning the contact hole after forming the contact hole.

6. The method as recited in claim 1, wherein the step of cleaning the contact hole includes the steps of:

performing a first cleaning in an ex-situ environment; and performing a second cleaning in an in-situ environment.

7. The method as recited in claim 6, wherein the step of performing the second cleaning is proceeded at a single wafer-type deposition equipment.

8. The method as recited in claim 6, wherein the step of performing the second cleaning is proceeded by descending a temperature ascended instantaneously up to about 900° C. to about 950° C. with a heating rate ranging from about 10° C. per second to about 100° C. per second in an atmosphere of hydrogen.

9. The method as recited in claim 6, wherein the step of performing the first cleaning is proceeded with a wet dip process.

10. The method as recited in claim 1, wherein the first silicon film is formed in a single wafer-type chemical vapor deposition equipment in an in-situ environment.

11. The method as recited in claim 1, wherein the first silicon film is deposited at a pressure ranging from about 5 Torr to about 50 Torr and a temperature ranging from about 500° C. to about 650° C. by providing a mixed gas of $SiH_4$, $H_2$ and about 1% of $PH_3$ added to the $H_2$.

12. The method as recited in claim 11, wherein the $SiH_4$, the $H_2$ and the mixed gas has a flow quantity ranging from about 50 sccm to about 300 sccm, from about 500 sccm to about 10000 sccm and from about 10 sccm to about 50 sccm, respectively.

13. The method as recited in claim 1, wherein the first doping concentration ranges from about $1 \times 10^{19}$ atoms/cm$^3$ to about $21 \times 10^{20}$ atoms/cm$^3$.

14. The method as recited in claim 1, wherein the second silicon film is formed in a tube-type chemical vapor deposition equipment.

15. The method as recited in claim 1, wherein the second silicon film is deposited at a pressure ranging from about 0.1 Torr to about 1 Torr and a temperature ranging from about 510° C. to about 610° C. while providing a mixed gas of $SiH_4$, $H_2$ and about 1% of $PH_3$ added to the $H_2$.

16. The method as recited in claim 1, wherein the $SiH_4$, the $H_2$ and the mixed gas has a flow quantity ranging from about 200 sccm to about 2000 sccm, from about 500 sccm to about 5000 sccm and from about 100 sccm to about 1000 sccm, respectively.

17. The method as recited in claim 1, wherein the second predetermined concentration ranges from about $1 \times 10^{20}$ atoms/cm$^3$ to about $31 \times 10^{21}$ atoms/cm$^3$.

* * * * *